(12) United States Patent
Kim et al.

(10) Patent No.: US 8,993,441 B2
(45) Date of Patent: Mar. 31, 2015

(54) METHODS OF FORMING A THIN LAYER AND METHODS OF MANUFACTURING A PHASE CHANGE MEMORY DEVICE USING THE SAME

(71) Applicant: Samsung Electronics Co., Ltd., Suwon-si, Gyeonggi-do (KR)

(72) Inventors: Do-Hyung Kim, Seongnam-si (KR); Eun-Tae Kim, Hwaseong-si (KR); Sung-Lae Cho, Gwacheon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 14/189,053

(22) Filed: Feb. 25, 2014

(65) Prior Publication Data
US 2014/0273395 A1     Sep. 18, 2014

(30) Foreign Application Priority Data
Mar. 13, 2013   (KR) .................. 10-2013-0026885

(51) Int. Cl.
*H01L 21/44* (2006.01)
*H01L 45/00* (2006.01)

(52) U.S. Cl.
CPC ............ *H01L 45/1616* (2013.01); *H01L 45/06* (2013.01); *H01L 45/1233* (2013.01); *H01L 45/144* (2013.01); *H01L 45/1683* (2013.01)
USPC .............. 438/681; 257/E21.09; 257/E21.068; 257/E21.101; 257/E21.662; 438/84; 438/102; 438/478; 438/483

(58) Field of Classification Search
USPC ............... 257/E21.09, E21.068; 438/84, 102, 438/478, 483, 681
See application file for complete search history.

(56) References Cited

U.S. PATENT DOCUMENTS

| | | | |
|---|---|---|---|
| 7,371,429 | B2 | 5/2008 | Lee et al. |
| 7,838,329 | B2 | 11/2010 | Hunks et al. |
| 8,093,140 | B2 | 1/2012 | Chen et al. |
| 8,187,914 | B2 | 5/2012 | Lee et al. |
| 2006/0172083 | A1 | 8/2006 | Lee et al. |

(Continued)

FOREIGN PATENT DOCUMENTS

| | | |
|---|---|---|
| KR | 10-0958331 B1 | 5/2010 |
| KR | 10-1071251 B1 | 10/2011 |
| KR | 10-2012-0003507 A | 1/2012 |

OTHER PUBLICATIONS

Suda et al., "GeSbTe Film Deposition by Tellurizatuon of Chemical Vapor Deposited GeSb", Japanese Journal of Applied Physics, vol. 52 (2013), 12806.*

*Primary Examiner* — Asok K Sarkar
(74) *Attorney, Agent, or Firm* — Lee & Morse, P.C.

(57) ABSTRACT

A method of forming a thin layer and a method of manufacturing a phase change memory device, the method of forming a thin layer including providing a first deposition source onto a substrate, the first deposition source not including tellurium; and providing a second deposition source onto the substrate, the second deposition source including a first tellurium precursor represented by the following Formula 1 and a second tellurium precursor represented by following the Formula 2:

$$Te(CH(CH_3)_2)_2 \qquad \text{Formula 1}$$

$$Te_n(CH(CH_3)_2)_2 \qquad \text{Formula 2}$$

wherein, in Formula 2, n is an integer greater than or equal to 2.

20 Claims, 14 Drawing Sheets

(56) References Cited

U.S. PATENT DOCUMENTS

| | | |
|---|---|---|
| 2007/0160760 A1 | 7/2007 | Shin et al. |
| 2009/0074652 A1 | 3/2009 | Dussarrat |
| 2009/0142881 A1 | 6/2009 | Xiao et al. |
| 2009/0215225 A1 | 8/2009 | Stender et al. |
| 2010/0261304 A1 | 10/2010 | Chang et al. |
| 2011/0197812 A1 | 8/2011 | Im et al. |
| 2012/0115315 A1 | 5/2012 | Zheng |

\* cited by examiner

2ND
DIRECTION   1ST
⊗ ——▶ DIRECTION

1ST
DIRECTION   2ND
⊗ ——▶ DIRECTION

2ND
DIRECTION    1ST
⊗  ⟶  DIRECTION

1ST
DIRECTION    2ND
⊗  ⟶  DIRECTION

2ND
DIRECTION ⊗ → 1ST DIRECTION

1ST
DIRECTION ⊗ → 2ND DIRECTION

METHODS OF FORMING A THIN LAYER AND METHODS OF MANUFACTURING A PHASE CHANGE MEMORY DEVICE USING THE SAME

CROSS-REFERENCE TO RELATED APPLICATION

Korean Patent Application No. 10-2013-0026885, filed on Mar. 13, 2013, in the Korean Intellectual Property Office, and entitled: "Methods of Forming a Thin Layer and Methods of Manufacturing a Phase Change Memory Device Using the Same," is incorporated by reference herein in its entirety.

BACKGROUND

1. Field

Embodiments relate to methods of forming a thin layer and methods of manufacturing a phase-change memory device using the same.

2. Description of the Related Art

In a phase change memory (PRAM) device, data may be stored using a resistance difference between an amorphous state and a crystalline state of a phase change material layer in accordance with the phase transition thereof. The phase change material layer may be formed using a chalcogenide compound, e.g., germanium (Ge)-antimony (Sb)-tellurium (Te).

SUMMARY

Embodiments are directed to methods of forming a thin layer and methods of manufacturing a phase-change memory device using the same.

The embodiments may be realized by providing a method of forming a thin layer, the method including providing a first deposition source onto a substrate, the first deposition source not including tellurium; and providing a second deposition source onto the substrate, the second deposition source including a first tellurium precursor represented by the following Formula 1 and a second tellurium precursor represented by following the Formula 2:

  Formula 1

  Formula 2 wherein, in Formula 2, n is an integer greater than or equal to 2.

The second tellurium precursor may be included in an amount of less than about 1 percent by weight, based on a total weight the second deposition source.

The first deposition source may include at least one of boron (B), carbon (C), nitrogen (N), oxygen (O), aluminum (Al), silicon (Si), phosphorus (P), sulfur (S), zinc (Zn), gallium (Ga), germanium (Ge), arsenic (As), selenium (Se), zirconium (Zr), cadmium (Cd), indium (In), tin (Sn), antimony (Sb), lead (Pb), bismuth (Bi), or polonium (Po).

The second deposition source may be provided onto the substrate at a temperature of less than about 120° C.

The second deposition source may be provided onto the substrate by a liquid delivery system.

The method may further include providing a reaction gas onto the substrate prior to providing the first deposition source onto the substrate, the reaction gas activating a reaction between the first deposition source and the second deposition source.

The first deposition source may be provided onto the substrate by a carrier gas.

The embodiments may also be realized by providing a method of manufacturing a phase change memory device, the method including forming a lower electrode on a substrate; forming a phase change material layer pattern on the lower electrode, wherein forming the phase change material layer pattern includes providing a first deposition source onto the lower electrode, the first deposition source not including tellurium; and providing a second deposition source onto the lower electrode, the second deposition source including a first tellurium precursor represented by the following Formula 1 and a second tellurium precursor represented by the following Formula 2; and forming an upper electrode on the phase change material layer pattern:

  Formula 1

  Formula 2 wherein, in Formula 2, n is an integer greater than or equal to 2.

Forming the lower electrode may include forming an insulating interlayer on the substrate such that the insulating interlayer has a lower electrode layer pattern; and removing an upper portion of the lower electrode layer pattern to form a recess.

Forming the phase change material layer pattern may include forming the phase change material layer on the lower electrode and the insulating interlayer to fill the recess; and planarizing an upper portion of the phase change material layer until a top surface of the insulating interlayer is exposed.

The second tellurium precursor may be included in an amount of less than about 1 percent by weight, based on a total weight the second deposition source.

The first deposition source may include at least one of boron (B), carbon (C), nitrogen (N), oxygen (O), aluminum (Al), silicon (Si), phosphorus (P), sulfur (S), zinc (Zn), gallium (Ga), germanium (Ge), arsenic (As), selenium (Se), zirconium (Zr), cadmium (Cd), indium (In), tin (Sn), antimony (Sb), lead (Pb), bismuth (Bi), or polonium (Po).

The second deposition source may be provided onto the substrate at a temperature of less than about 120° C.

Forming the phase change material layer pattern on the lower electrode may further include providing a reaction gas onto the substrate, the reaction gas activating a reaction between the first deposition source and the second deposition source, prior to providing the first deposition source.

The embodiments may also be realized by providing a method of forming a thin layer, the method including providing a substrate; providing a first deposition source onto the substrate, the first deposition source being free of tellurium; and providing a second deposition source onto the substrate, the second deposition source including a first tellurium precursor represented by the following Formula 1:

  Formula 1 a second tellurium precursor represented by the following Formula 2:

  Formula 2 wherein, in Formula 2, n is an integer greater than or equal to 2.

The first deposition source may be provided onto the substrate prior to providing the second deposition source onto the substrate.

The first deposition source may be provided simultaneously with the second deposition source onto the substrate.

The second tellurium precursor may be included in the second deposition source in an amount of less than about 1 percent by weight, based on a total weight the second deposition source.

The second deposition source may be provided onto the substrate at a temperature of less than about 120° C.

Providing the first deposition source and the second deposition source onto the substrate may be a part of a chemical vapor deposition process or an atomic layer deposition process.

BRIEF DESCRIPTION OF THE DRAWINGS

Features will be apparent to those of skill in the art by describing in detail exemplary embodiments with reference to the attached drawings in which.

DETAILED DESCRIPTION

Figure 1:
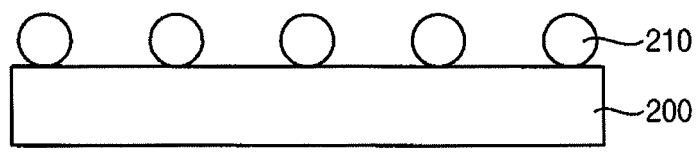
FIGS. 1 to 3 illustrate cross-sectional views of stages of a method of forming a thin layer in accordance with example embodiments.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. Like reference numerals refer to like elements throughout.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. As used herein, the term "and/or" includes any and all combinations of one or more of the associated listed items.

It will be understood that, although the terms first, second, third, fourth etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present application.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present specification.

Unless otherwise defined, all terms (including technical and scientific terms) used herein have the same meaning as commonly understood by one of ordinary skill in the art to which this specification belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
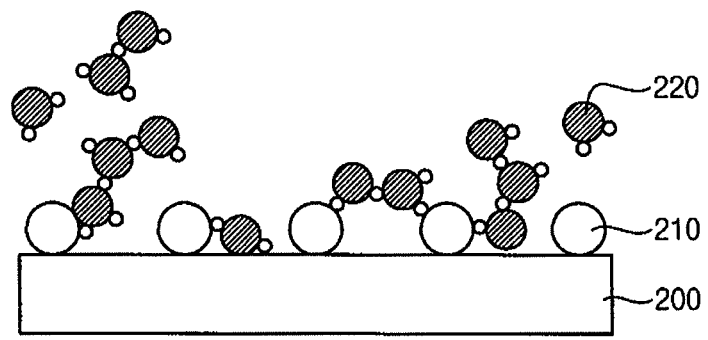
Figure 3:
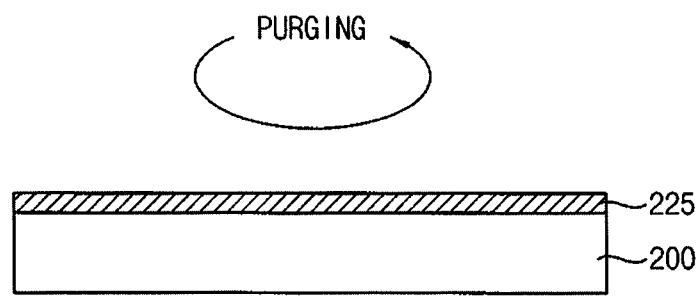

FIGS. 1 to 3 illustrate cross-sectional views of stages of a method of forming a thin layer in accordance with example embodiments.

Referring to FIG. 1, a first deposition source 210 not including or free of tellurium (Te) may be provided onto a substrate 200 in a chamber (not illustrated) using a carrier gas including an inert gas, e.g., argon, helium, or the like.

A phase change material layer (of which a resistance may be changed between an amorphous state and a crystalline state thereof) may be formed to include a chalcogenide compound such as GeSbTe (GST) or a chalcogenide compound doped with boron (B), carbon (C), nitrogen (N), silicon (Si), and/or a metal. Thus, the first deposition source 210 may include boron (B), carbon (C), nitrogen (N), oxygen (O), aluminum (Al), silicon (Si), phosphorus (P), sulfur (S), zinc (Zn), gallium (Ga), germanium (Ge), arsenic (As), selenium (Se), zirconium (Zr), cadmium (Cd), indium (In), tin (Sn), antimony (Sb), lead (Pb), bismuth (Bi), and/or polonium (Po).

In an implementation, the first deposition source 210 may be vaporized by a bubbler system to be provided onto the substrate 200, so that a material, e.g., boron (B), carbon (C), nitrogen (N), oxygen (O), aluminum (Al), silicon (Si), phosphorus (P), sulfur (S), zinc (Zn), gallium (Ga), germanium (Ge), arsenic (As), selenium (Se), zirconium (Zr), cadmium (Cd), indium (In), tin (Sn), antimony (Sb), lead (Pb), bismuth (Bi), polonium (Po), or the like, may be adsorbed onto the substrate 200.

Referring to FIG. 2, a second deposition source 220 (including a first tellurium precursor represented by following Formula 1 and a second tellurium precursor represented by following Formula 2) may be provided onto the substrate 200 to be reacted with the first deposition source 210.

$$Te(CH(CH_3)_2)_2 \quad \text{Formula 1}$$

$$Te_n(CH(CH_3)_2)_2 \quad \text{Formula 2}$$

In Formula 2, n may be an integer greater than or equal to 2.

In an implementation, the second deposition source 220 may be provided onto the substrate 200 by a liquid delivery system (LDS), so that the first and second tellurium precursors may be reacted with the material of the first deposition source 210 to form a thin layer 225 (refer to FIG. 3) on the substrate 200.

Maintaining a suitable amount of tellurium (Te) atoms in the second deposition source 220 may help prevent a decrease in a deposition rate of the thin layer 225, and may help prevent excessive generation of particles during forming the thin layer 225. In an implementation, the second tellurium precursor may be included at a rate or in an amount of less than about 1 percent by weight, with respect to or based on a total weight of the second deposition source 220. For example, the second tellurium precursor may have more tellurium (Te) atoms than the first tellurium precursor, and thus the concentration of the second tellurium precursor in the second deposition source 220 may be controlled to help improve the deposition rate of the thin layer 225 and to reduce and/or prevent the deterioration of the thin layer 225 caused by the particle generation.

Maintaining the second deposition source 220 at a suitable temperature, or maintaining the chamber at a suitable pressure, may help reduce and/or prevent separation of tellurium (Te) atoms from the first and second tellurium precursors, thereby helping to prevent an excessive increase in an amount of the tellurium (Te) atoms in the second deposition source 220. Thus, in an implementation, the second deposition source 220 may be provided onto the substrate 200 at a temperature of less than about 120° C., and the thin layer 225 may be formed at a temperature of less than about 350° C. and under a pressure of less than about 20 torr, so that excessive particle generation may be reduced or prevented.

Alternatively, the first and second deposition sources 210 and 220 may be provided onto the substrate 200 simultaneously. For example, when the thin layer 225 is formed by an atomic layer deposition (ALD) process, the first deposition source 210 may be provided before the second deposition source 220 is provided. When the thin layer 225 is formed by a CVD process, the first and second deposition sources 210 and 220 may be provided simultaneously.

In an implementation, a reaction gas that activates the reaction between the first deposition source 210 and the second deposition source 220 may be provided onto the substrate 200 before providing the first deposition source 210. The reaction gas may include, e.g., hydrogen ($H_2$), ammonia ($NH_3$), hydrazine ($N_2H_4$), silane ($SiH_4$), diborane ($B_2H_6$), oxygen ($O_2$), ozone ($O_3$)), water ($H_2O$), and/or a compound thereof, which may separate materials such as antimony (Sb), germanium (Ge), or the like, and tellurium (Te), for forming the thin layer 225, from the first and second deposition sources 210 and 220. In an implementation, the reaction gas may be provided onto the substrate 200 together with the first and second deposition sources 210 and 220.

Referring to FIG. 3, a purging process may be performed on the substrate 200. Accordingly, by-products and/or parts first and second deposition sources 210 and 220, not adsorbed onto the substrate 200 and remaining in the chamber, may be removed.

The purging process may be performed by exhausting an inside of the chamber using an inert gas, e.g., argon, helium, or the like, and/or depressurizing the inside of the chamber.

Performing a deposition process for forming the thin layer 225 once has been described hitherto. In an implementation, the deposition process may be performed multiple times in accordance with a desired thickness of the thin layer 225. In this case, however, more by-products may be generated due to a difference of periods for providing the first and second deposition sources 210 and 220. Thus, when the thin layer 225 is formed by an ALD process, the purging process may be further performed between providing the first deposition source 210 and providing the second deposition source 220 in order to remove remaining portions of the first and second deposition sources 210 and 220 that have not been adsorbed on the substrate 200.

As described above, the thin layer 225 may be formed by a CVD process or an ALD process using a deposition source including the first tellurium precursor represented by Formula 1 and the second tellurium precursor represented by Formula 2. Thus, the deposition rate of the thin layer 225 may not be decreased, and particles may not be excessively generated.

In an implementation, the deposition source may be provided at a temperature of less than about 120° C., so that the amount of tellurium atoms in the deposition source may not be excessively increased. As a result, particles may not be excessively generated during the formation of the thin layer 225 so that deterioration of the thin layer 225 may be prevented.

Evaluation of the Stability of a Deposition Source in Accordance with a Tellurium Concentration Therein To evaluate the stability of a deposition source in accordance with a tellurium concentration therein, a composition ratio of the second tellurium precursor in the second deposition source (which may include the first tellurium precursor represented by Formula 1 and the second tellurium precursor represented by Formula 2) was varied. Whether the second deposition source changed according to the lapse of time was measured in each case. For example, a second deposition source including the second tellurium precursor in an amount of about 0.8 percent by weight (Example) and a second deposition source including the second tellurium precursor in an amount of about 1.0 percent by weight (Comparative Example) were stored at a temperature of about 80° C., and UV spectra of Example and Comparative Example were measured in accordance with the lapse of time. The results of the measured UV spectra are shown in following Table 1.

TABLE 1

|  | Concentration of the second tellurium precursor in the second deposition source (wt %) | Change of the UV spectrum |
|---|---|---|
| Example | 0.8 | not changed even after 34 days |
| Comparative Example | 1.0 | changed after 14 days |

As may be seen in Table 1, a UV spectrum of the Comparative Example began to change after 2 weeks, and was changed significantly thereafter, while a UV spectrum of the Example was not changed even after 34 days. Thus, including the second tellurium precursor in an amount of less than about 1 percent by weight with respect to or based on the total weight of the second deposition source, the deposition source may have stability. Thus, a thin layer may be formed easily by a CVD process or an ALD process.

FIGS. 4 to 27 illustrate cross-sectional views of stages of a method of manufacturing a phase change memory device in accordance with example embodiments. FIG. 28 illustrates a perspective view of a stage of the method of manufacturing the semiconductor device in accordance with example embodiments. For example, FIGS. 4, 6, 8, 10, 12, 14, 16, 18, 20, 22, 24 and 26 illustrate cross-sectional views of the semiconductor device cut along a first direction, and FIGS. 5, 7, 9, 11, 13, 15, 17, 19, 21, 23 and 25 illustrate cross-sectional views of the semiconductor device cut along a second direction substantially perpendicular to the first direction.

Figure 4:
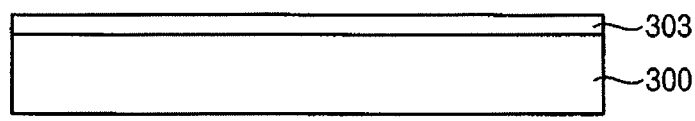
FIGS. 4 to 27 illustrate cross-sectional views of stages of a method of manufacturing a phase change memory device in accordance with example embodiments.
Figure 5:
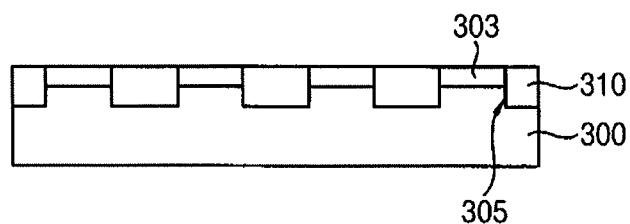

Referring to FIGS. 4 and 5, after an impurity region is formed by an ion implantation process onto an upper portion of a substrate 300, an isolation layer pattern 310 may be formed at an upper portion of the substrate 300 to divide the substrate 300 into an active region and a field region, and word lines 303 may be formed.

The impurity region may be formed by implanting first impurities, e.g., n-type impurities such as phosphorus, arsenic, or the like, or p-type impurities such as boron, gallium, or the like, into upper portion of the substrate 300. In an implementation, the first impurities may be n-type impurities. Before forming the impurity region, a well region (not illustrated) doped with impurities of a conduction type different from that of the first impurities may be formed in the substrate 300.

In an implementation, the isolation layer pattern 310 may be formed by a shallow trench isolation (STI) process. For example, after trenches 305 are formed on the substrate 300, an isolation layer may be formed on the substrate 300 to sufficiently fill the trenches 305, and an upper portion of the isolation layer may be planarized until a top surface of the substrate 300 is exposed to form the isolation layer pattern 310. The isolation layer may be formed using a silicon oxide, e.g., borophospho silicate glass (BPSG), phosphor silicate glass (PSG), undoped silicate glass (USG), flowable oxide (FOX), tetraethylortho silicate (TEOS), plasma enhanced tetraethylortho silicate (PE-TEOS), high density plasma chemical vapor deposition (HDP-CVD) oxide, or the like. In an implementation, the planarization process may be performed by a chemical mechanical polishing (CMP) process and/or an etch back process. In an implementation, the isolation layer pattern 310 may be formed to extend in a first direction parallel to a top surface of the substrate 300, and a plurality of isolation layer patterns 310 may be formed in a second direction substantially perpendicular to the first direction. Accordingly, the active region of the substrate 300 may also be formed to extend in the first direction, and a plurality of active regions may be formed in the second direction.

In an implementation, the isolation layer patterns 310 may be formed to have a bottom surface lower than that of the impurity region. Thus, the impurity region formed at an upper portion of the active region may be divided into a plurality of word lines 303 by the isolation layer patterns 310. In an implementation, each word line 303 may extend in the first direction, and a plurality of word lines 303 may be formed in or along the second direction.

Figure 6:
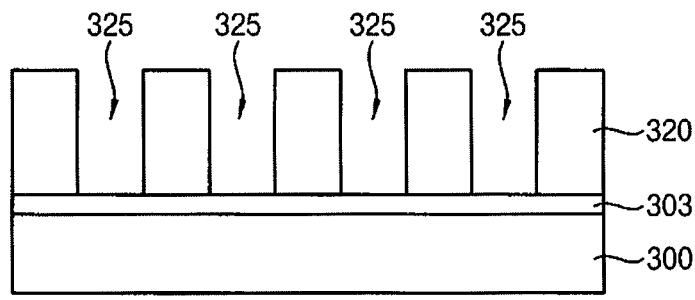
Figure 7:
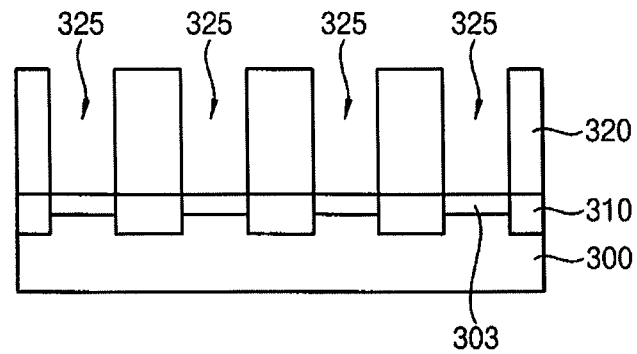

Referring to FIGS. 6 and 7, a first insulating interlayer 320 having a plurality of first contact holes 325 therethrough, which may be arranged in both of the first and second directions at regular distances, may be formed on the substrate 300 and the isolation layer patterns 310. The first contact holes 325 may form a first contact hole array.

The first contact holes 325 may be formed by forming the first insulating interlayer 320 on the substrate 300, and anisotropically etching the first insulating interlayer 320 to expose top surfaces of the word lines 303 of the substrate 300.

The first insulating interlayer 320 may be formed to include an insulating material such as an oxide, a nitride, or the like.

Figure 8:
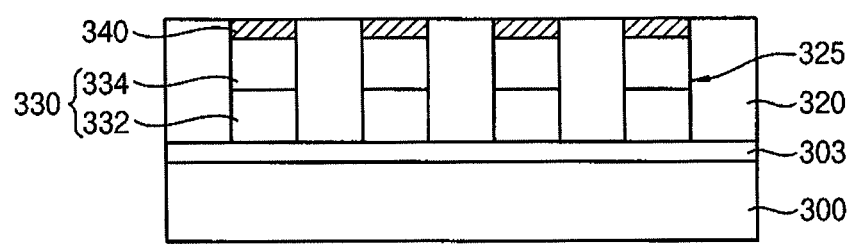
Figure 9:
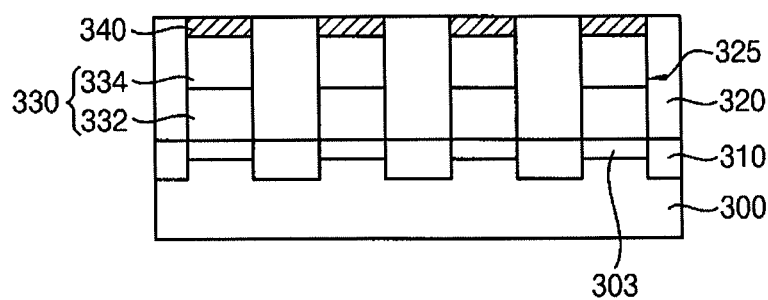

Referring to FIGS. 8 and 9, a diode 330 and an ohmic pattern 340 may be sequentially formed to fill each first contact hole 325.

In an implementation, a selective epitaxial growth (SEG) process may be performed using exposed top surfaces of the word lines 303 as a seed layer to form a silicon layer filling the first contact holes 325. Second and third impurities may be implanted into lower and upper portions of the silicon layer, respectively, to form the diode 330. Accordingly, the lower and the upper portions of the silicon layer may be defined as a lower diode layer 332 and an upper diode layer 334, respectively. The lower diode layer 332 may contact the top surfaces of the word lines 303. Before implanting the second and third impurities thereinto, a planarization process may be further performed on a top surface of the silicon layer, so that a top surface of the diode 330 has a height substantially the same as that of the first insulating interlayer 320.

In an implementation, the second impurities may include n-type impurities, e.g., phosphorous, arsenic, or the like, and the third impurities may include p-type impurities, e.g., boron, gallium, or the like.

In an implementation, a metal layer (not illustrated) may be formed on the diode 330 and the first insulating interlayer 320. The metal layer and silicon of the diode 330 may be reacted with each other by a heat treatment process to form the ohmic pattern 340, which may help reduce a contact resistance between the diode 330 and a subsequently formed contact plug 360 (refer to FIGS. 12 and 13). In an implementation, the metal layer may be formed to include a metal such as cobalt, nickel, tungsten, or the like. Thus, the ohmic pattern 340 may be formed to include a metal silicide such as cobalt silicide, nickel silicide, tungsten silicide, or the like. A portion of the metal layer that has not been reacted may be removed.

Alternatively, the ohmic pattern 340 may be formed by directly implanting metal ions into an upper portion of the diode 330. In an implementation, the process for forming the ohmic pattern 340 may be omitted.

The diode 330 and the ohmic pattern 340 may be formed in each first contact hole 325. Thus, a plurality of diodes 330 and a plurality of ohmic patterns 340 may be formed to form a diode array and an ohmic pattern array, respectively.

Figure 10:
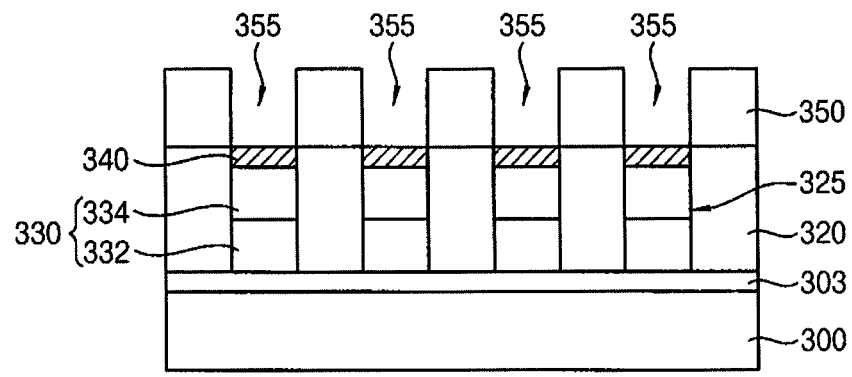
Figure 11:
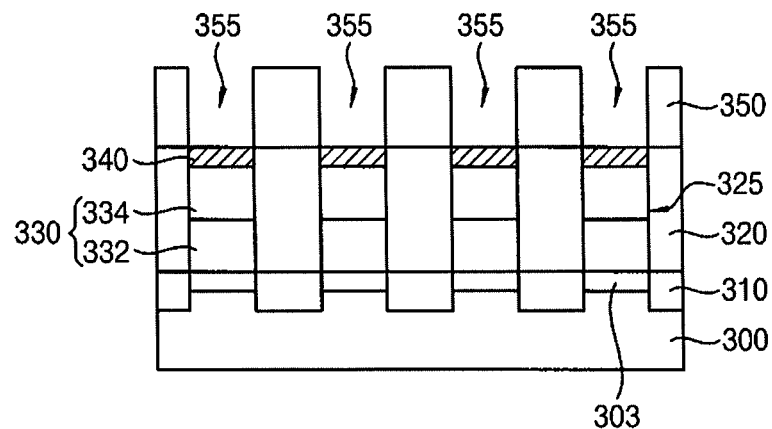

Referring to FIGS. 10 and 11, processes substantially the same as or similar to those illustrated with reference to FIGS. 6 and 7 may be performed, so that a second insulating interlayer 350 having a plurality of second contact holes 355 therethrough (which may be arranged in the first and second directions at regular distances), may be formed on the first insulating interlayer 320 and the ohmic patterns 340.

For example, the second contact holes 355 may be formed by forming the second insulating interlayer 350 on the first insulating interlayer 320 and the ohmic patterns 340 using an insulating material such as an oxide, a nitride, or the like, and anisotropically etching the second insulating interlayer 350 to expose top surfaces of the ohmic patterns 340. The second contact holes 355 may form a second contact hole array.

Figure 12:
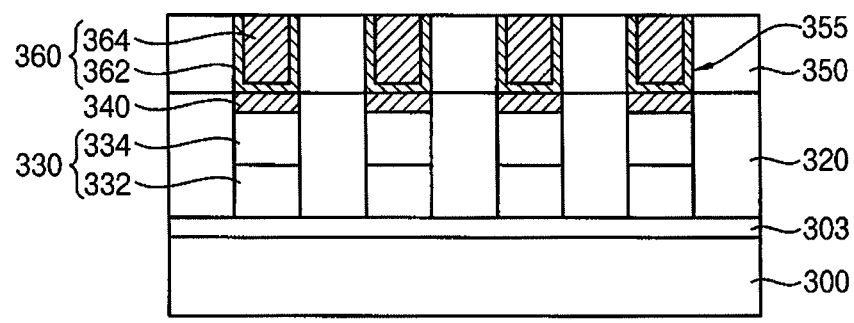
Figure 13:
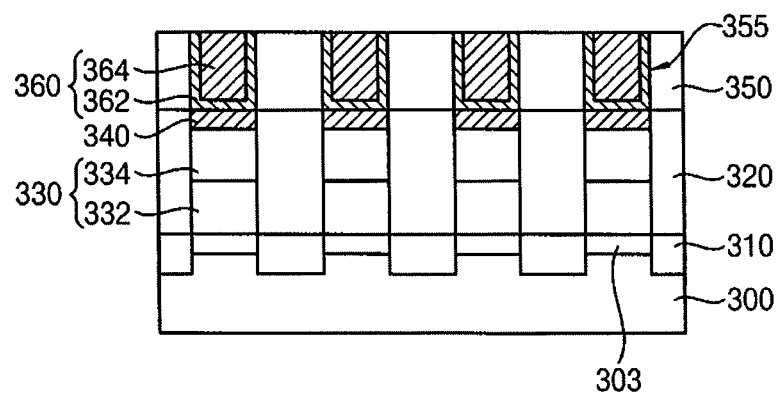

Referring to FIGS. 12 and 13, a contact plug 360 may be formed to fill each second contact hole 355. Thus, a plurality of contact plugs 360 may be formed both in the first and second directions to form a contact plug array.

In an implementation, the contact plug 360 may be formed by forming a first barrier layer on exposed top surfaces of the ohmic patterns 340, sidewalls of the second contact holes 355 and a top surface of the second insulating interlayer 350, forming a first conductive layer on the first barrier layer to sufficiently fill remaining portions of the second contact holes 355, and planarizing upper portions of the first barrier layer and the first conductive layer until a top surface of the second insulating interlayer 350 is exposed. Thus, the contact plug 360 may be formed to include a first barrier layer pattern 362 and a first conductive layer pattern 364, and the first barrier layer pattern 362 may surround a sidewall and a bottom of the first conductive layer pattern 364.

The first barrier layer may be formed to include a metal or a metal nitride, e.g., titanium, titanium nitride, or the like, and the first conductive layer may be formed to include a low resistance metal, e.g., copper, tungsten, aluminum, or the like.

Alternatively, in an implementation, the contact plug 360 may not be formed and the process for forming the contact plug 360 may be omitted.

Figure 14:
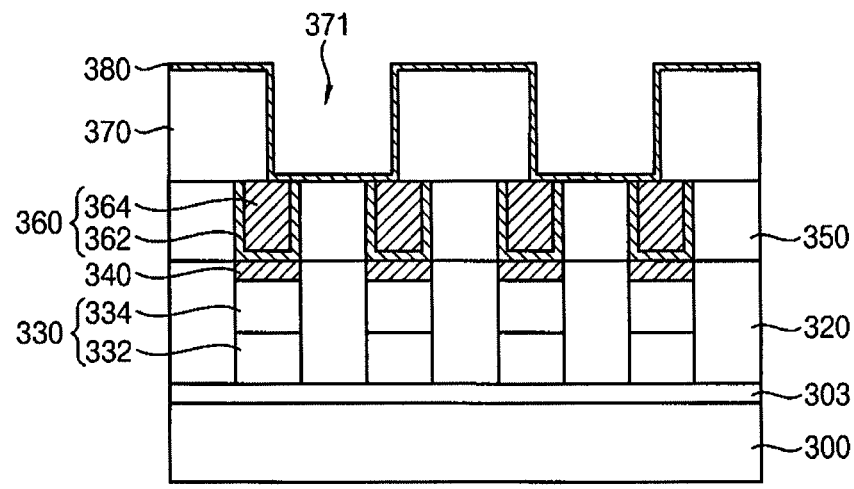
Figure 15:
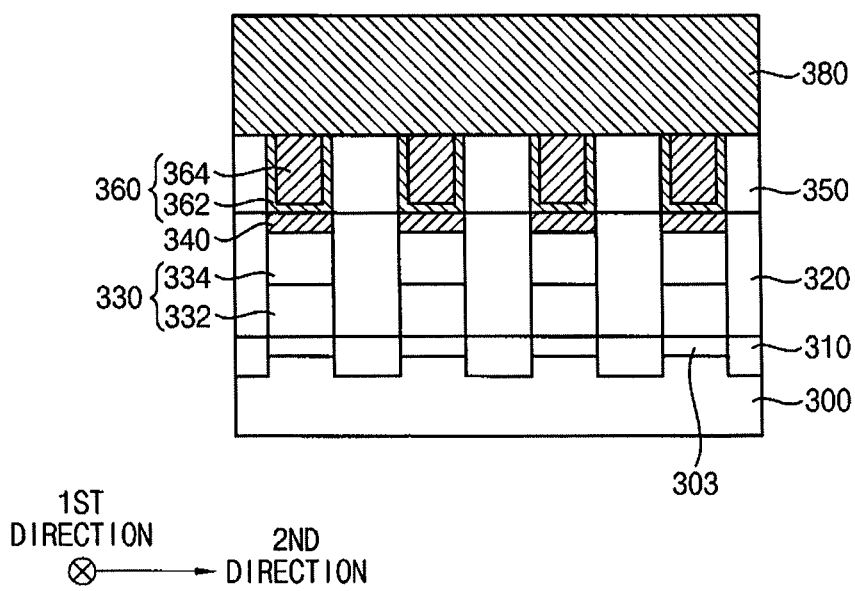

Referring to FIGS. 14 and 15, a third insulating interlayer 370 (having a first opening 371 partially exposing a top surface of the contact plug 360) may be formed on the second insulating interlayer 350. A lower electrode layer 380 may be formed on a sidewall of the first opening 371, an exposed top surface of the contact plug 360, the second insulating interlayer 350, and the third insulating interlayer 370.

In an implementation, a plurality of first openings 371 may be formed in the first direction, and each first opening 371 may be formed to extend in the second direction. Two contact plugs 360 adjacent to each other in the first direction may be exposed by the same first opening 371.

The lower electrode layer 380 may be formed to include a metal or a metal compound, e.g., a metal nitride or a metal silicon nitride, and may be conformally formed on the exposed top surfaces of the contact plugs 360 and the second insulating interlayer 350, the sidewalls of the first openings 371, and the top surface of the third insulating interlayer 370.

The third insulating interlayer 370 may be formed to include an insulating material, e.g., an oxide, a nitride, or the like.

Figure 16:
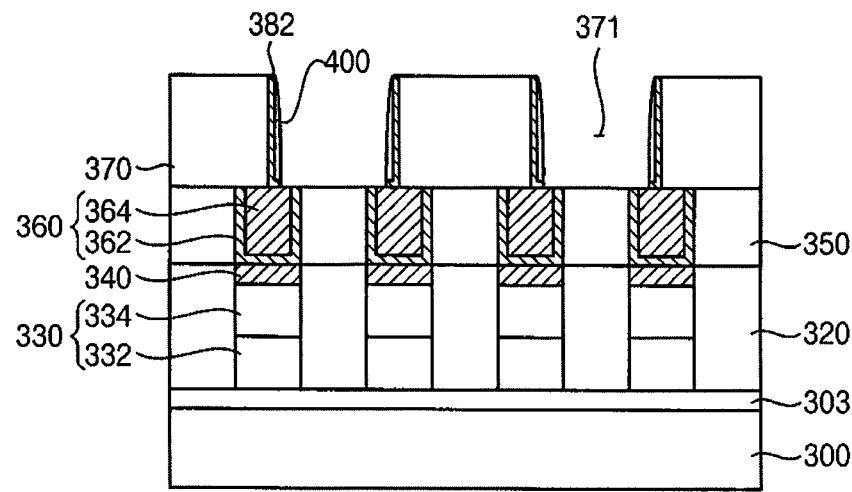
Figure 17:
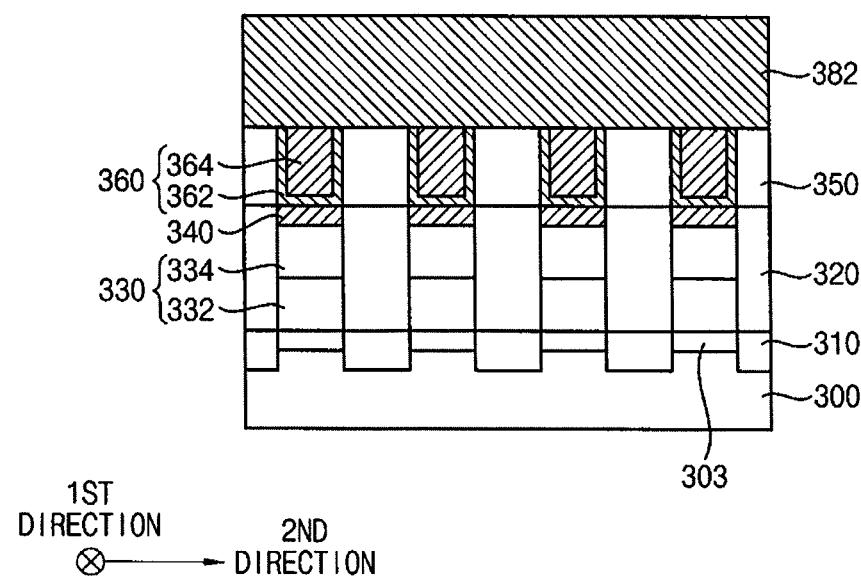

Referring to FIGS. 16 and 17, a spacer 400 may be formed on the lower electrode layer 380. The lower electrode layer 380 may be etched using the spacer 400 as an etching mask to form a lower electrode layer pattern 382.

The spacer 400 may be formed by forming a spacer layer on the lower electrode layer 380, and anisotropically etching the spacer layer. Thus, two spacers 400 may be formed in the first opening 371. Accordingly, as the plurality of first openings 371 may be formed in the first direction, a plurality of spacers 400 may be also formed in the first direction.

Accordingly, the lower electrode layer pattern 382 may be formed to extend in the second direction on the sidewall of the first opening 371, and a plurality of first electrode layer patterns 382 may be formed in the first direction. The lower electrode layer 380 may be conformally formed on the sidewall of the first opening 371 and the exposed top surface of the contact plug 360. Thus, each lower electrode layer pattern 382 may have a cross-section cut along the first direction of an "L" shape or a "J-like" shape. Accordingly, as the lower electrode layer pattern 382 may have the cross-section of an "L" shape, a contact area between the lower electrode layer pattern 382 and the contact plug 360 may be larger than that between the lower electrode layer pattern 382 and subsequently formed phase change materials layer pattern 470 (see FIGS. 24 and 25), so that the phase change material layer pattern 470 may be efficiently heated even with a small current.

The spacer layer may be formed to include an insulating material such as an oxide, a nitride, or the like, and may be formed to include a material substantially the same as that of the third insulating interlayer 370.

Figure 18:
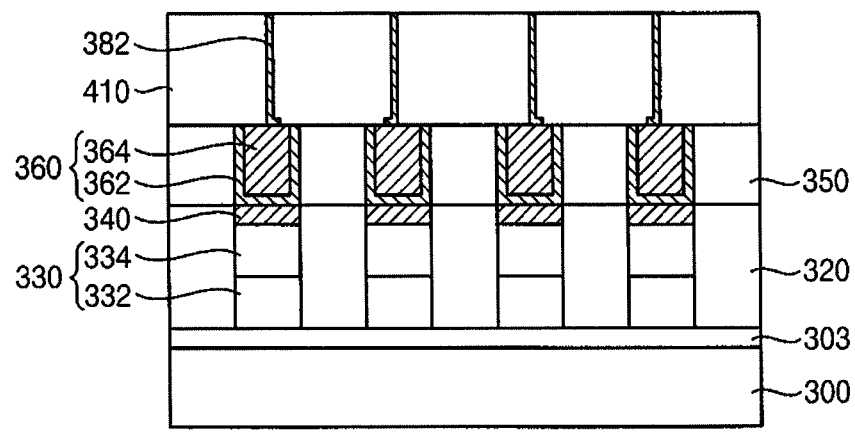
Figure 19:
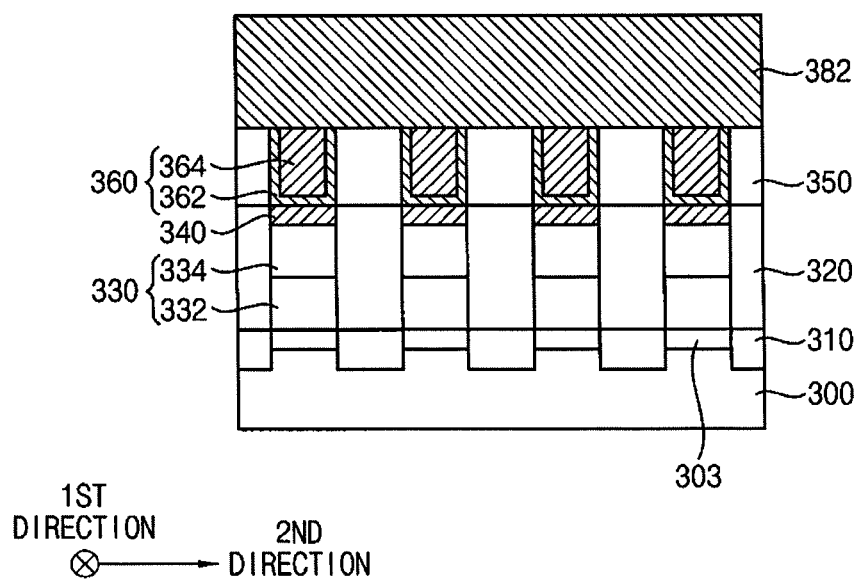

Referring to FIGS. 18 and 19, a fourth insulating interlayer (not illustrated) sufficiently filling remaining portions of the first opening 371 may be formed on the exposed top surfaces of the contact plugs 360 and the second insulating interlayer 350, the spacers 400, the lower electrode layer patterns 382, and a top surface of the third insulating interlayer 370, and may be planarized until a top surface of the lower electrode layer patterns 382 is exposed.

The fourth insulating interlayer may be formed to include an insulating material such as an oxide, a nitride, or the like, and may be formed to include a material substantially the same as that of the third insulating interlayer 370 and the spacer 402. Thus, the fourth insulating interlayer, the spacer 400, and the third insulating interlayer 370 may be merged, and hereinafter, the merged layer may be referred to simply as a fourth insulating interlayer 410. For example, the fourth insulating interlayer 410 may surround sidewalls of the lower electrode layer patterns 382, and may be formed on the contact plugs 360 and the second insulating interlayer 350.

Figure 20:
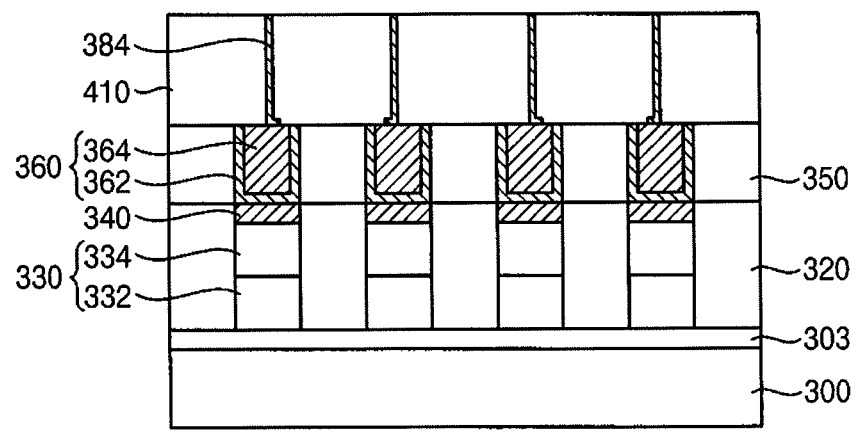
Figure 21:
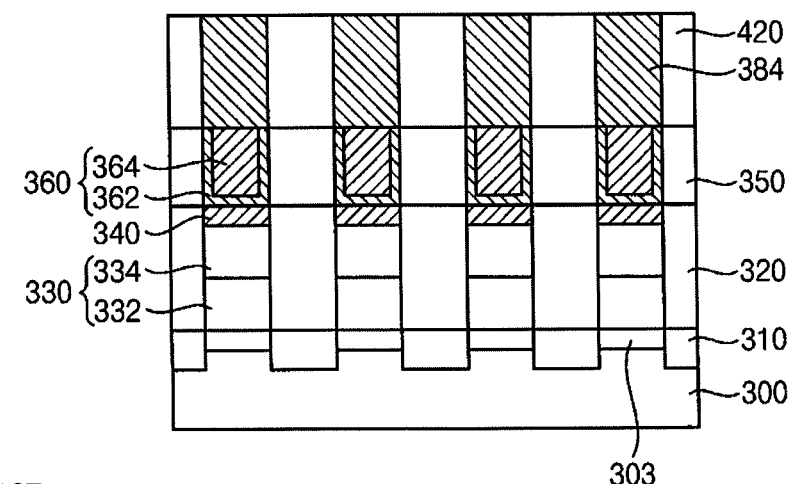

Referring FIGS. 20 and 21, the lower electrode pattern 382 may be partially etched by an etching process using a photoresist pattern (not illustrated) extending in the first direction to form a plurality of lower electrodes 384 in the second direction. The plurality of lower electrode patterns 382 may be formed in the first direction, and thus the plurality of lower electrodes 384 may be also formed in the first direction. Accordingly, a lower electrode array including the plurality of lower electrodes 384, which may be formed both in the first and second directions, may be formed.

When the lower electrode pattern 382 is etched, the fourth insulating interlayer 410 may be also partially etched to form a second opening (not illustrated), and a fifth insulating interlayer 420 may be formed to fill the second opening.

Figure 22:
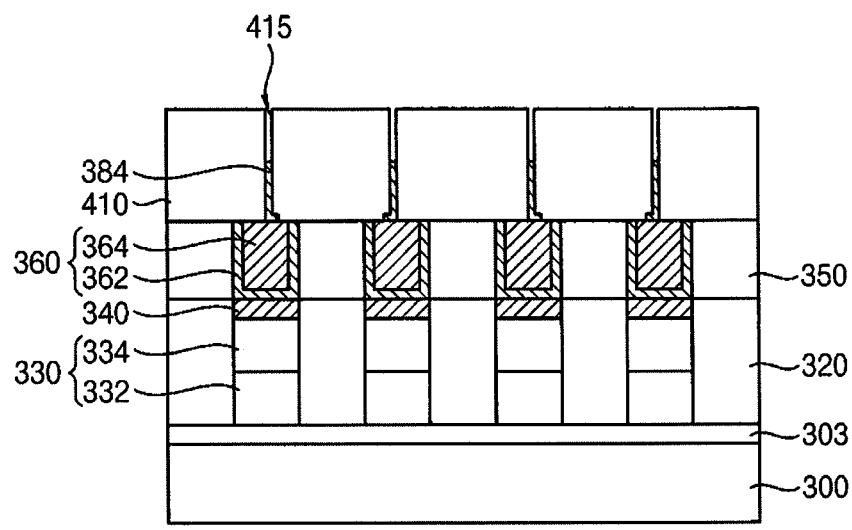
Figure 23:
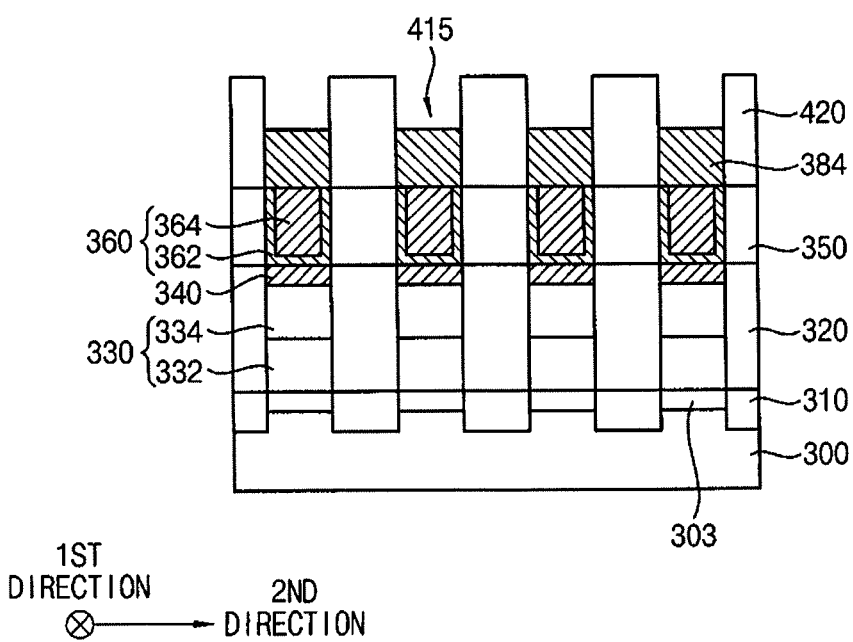

Referring to FIGS. 22 and 23, an upper portion of each lower electrode 384 may be removed to form a recess 415.

In an implementation, the lower electrodes 384 may be partially removed by, e.g., a wet etching process. The plurality of lower electrodes 384 may be formed both in the first and second directions to form the lower electrode array, and thus a plurality of recesses 415 may be formed both in the first and second directions to form a recess array.

Figure 24:
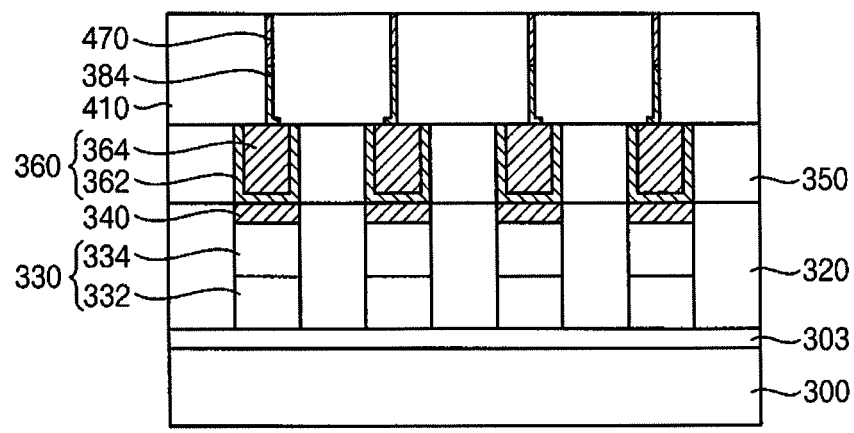
Figure 25:
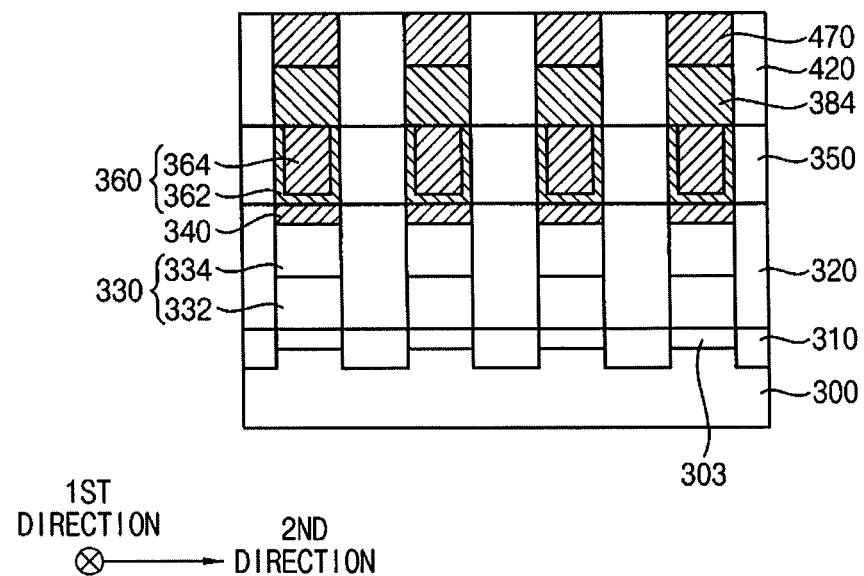

Referring to FIGS. 24 and 25, processes substantially the same as or similar to those illustrated with reference to FIGS. 1 to 3 may be performed, so that the phase change material layer pattern 470 may be formed to fill each recess 415.

For example, after a first deposition source not including tellurium (Te) is provided onto the substrate 300, a second deposition source including a first tellurium precursor represented by Formula 1 and a second tellurium precursor represented by Formula 2 may be provided onto the substrate 300. Thus, a phase change material layer may be formed on the lower electrode 384 and the fourth insulating interlayer 410 to fill each recess 415. After a purging process is performed on the substrate 300 to remove remaining portions of the first and second deposition sources that have not been adsorbed on the lower electrodes 384 and the fourth insulating interlayer 410, an upper portion of the phase change material layer may be planarized by performing a CMP process and/or an etch back process until a top surface of the fourth insulating interlayer 410 is exposed. Accordingly, a plurality of phase change material layer patterns 470 may be formed on top surfaces of lower electrodes 384, both in the first and second directions, to form a phase change material layer pattern array.

The phase change material layer pattern 470 may be formed to include a chalcogenide compound such as GeSbTe (GST) or a chalcogenide compound doped with boron (B), carbon (C), nitrogen (N), silicon (Si), and/or a metal. Thus, the first deposition source may include boron (B), carbon (C), nitrogen (N), oxygen (O), aluminum (Al), silicon (Si), phosphorus (P), sulfur (S), zinc (Zn), gallium (Ga), germanium (Ge), arsenic (As), selenium (Se), zirconium (Zr), cadmium (Cd), indium (In), tin (Sn), antimony (Sb), lead (Pb), bismuth (Bi), and/or polonium (Po).

In an implementation, the first deposition source may be vaporized by a bubbler system, and the second deposition source may be provided by a liquid delivery system (LDS). In an implementation, the first deposition source may be provided onto the substrate 300 using a carrier gas.

Maintaining a sufficient amount of tellurium (Te) atoms in the second deposition source may help prevent a deterioration in gap-fill characteristics of the phase change material layer filling each recess 415, which may otherwise be caused by a decrease in the deposition rate. Maintaining a sufficient amount of tellurium (Te) atoms in the second deposition source may help prevent excessive generation of particles during the formation of the phase change material layer. In an implementation, the second tellurium precursor may be included in an amount of less than about 1 percent by weight, with respect to or based on the total weight of the second deposition source. For example, the concentration of the second tellurium precursor in the second deposition source may be controlled to help improve the deposition rate of the phase change material layer and to help reduce and/or prevent deterioration of the phase change material layer due to the particle generation.

Maintaining the second deposition source at a suitable temperature, or maintaining the chamber for forming the phase change material layer at a suitable pressure may help reduce and/or prevent separation of tellurium (Te) atoms from the first and second tellurium precursors, thereby helping to prevent an excessive increase in an amount of the tellurium (Te) atoms in the deposition source for forming the phase change material layer. Thus, in an implementation, the second deposition source may be provided onto the substrate 300 at a temperature of less than about 120° C., and the phase change material layer may be formed at a temperature of less than about 350° C. and under a pressure of less than about 20 torr.

In an implementation, a reaction gas for activating the reaction between the first deposition source and the second deposition source may be provided onto the substrate 300 before providing the first deposition source. The reaction gas may include, e.g., hydrogen ($H_2$), ammonia ($NH_3$), hydrazine ($N_2H_4$), silane ($SiH_4$), diborane ($B_2H_6$), oxygen ($O_2$), ozone ($O_3$), water ($H_2O$), and/or a compound of thereof, which may separate such materials as antimony (Sb), germanium (Ge), or the like, and tellurium (Te) for forming the phase change material layer, from the first and second deposition sources. Thus, the phase change material layer may be formed using the materials by the reaction. Alternatively, the reaction gas may be provided onto the substrate 300 together with the first and second deposition sources.

Figure 26:
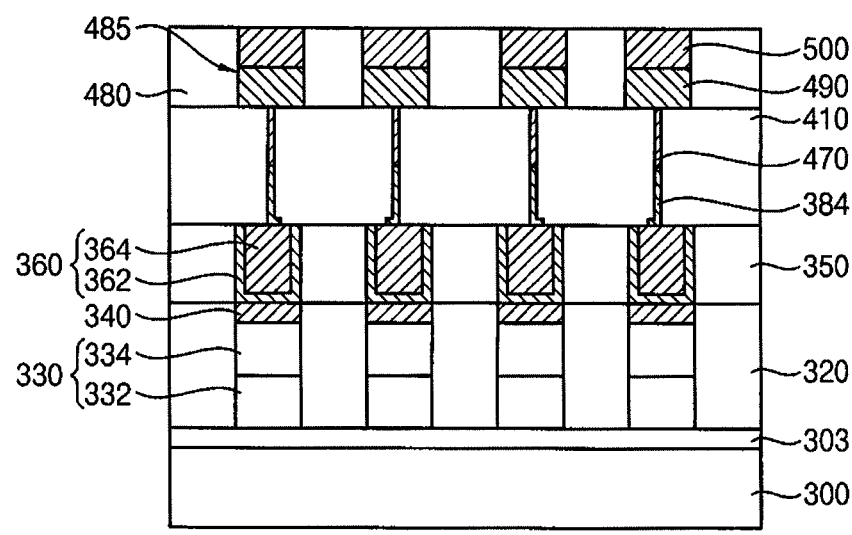
Figure 27:
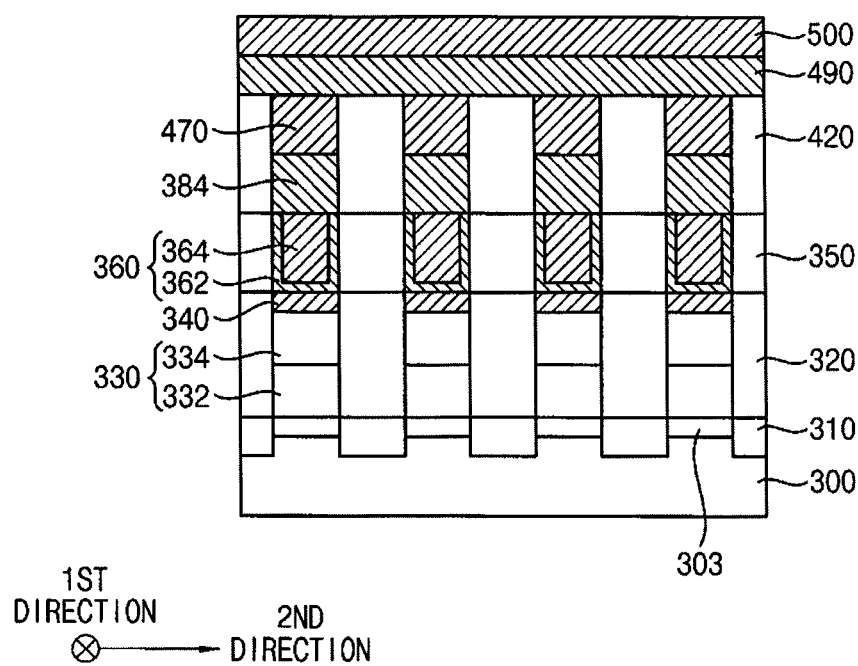
Figure 28:
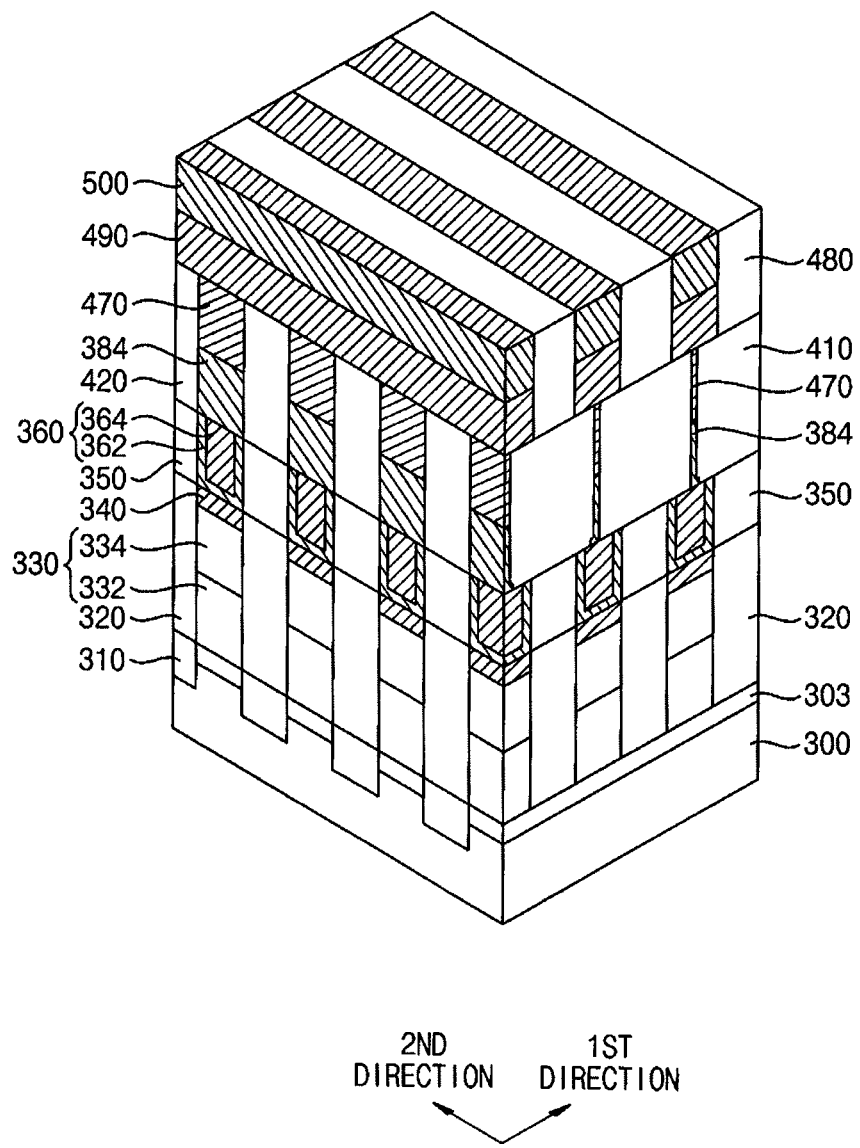
FIG. 28 illustrates a perspective view of a stage of the method of manufacturing the phase change memory device in accordance with an embodiment.

Referring to FIGS. 26 to 28, a sixth insulating interlayer 480 having a plurality of third openings 485 (each of which exposing a top surface of the phase change material layer pattern 470) may be formed on the fourth and fifth insulating interlayer patterns 410 and 420. An upper electrode 490 and a bit line 500 filling each third opening 485 may be sequentially formed.

The upper electrode 490 may be formed by following steps. For example, after a second conductive layer is formed on exposed top surfaces of the phase change material layer patterns 470 and top surfaces of the fourth to sixth insulating interlayer patterns 410, 420, and 480 to sufficiently fill the third openings 485, the second conductive layer may be planarized until the top surface of the sixth insulating interlayer 480 is exposed. Upper portions of the planarized second conductive layer may be removed by, e.g., a wet etching process, to form the upper electrode 490. Accordingly, the upper electrode 490 may be formed to cover the top surface of each phase change material layer pattern 470.

A third conductive layer may be formed on top surfaces of the upper electrodes 490 and the sixth insulating interlayer 480 to sufficiently fill spaces from which the upper portions of the second conductive layer are removed. The third conductive layer may be planarized until the top surface of the sixth insulating interlayer 480 is exposed to form the bit line 500.

In an implementation, the plurality of third openings 485 may be formed in the first direction. Thus, a plurality of upper electrodes 490 may be also formed in the first direction to form an upper electrode column. As a result, a plurality of bit lines 500 may be also formed in the first direction.

In an implementation, the sixth insulating interlayer 480 may be formed to include an insulating material such as an oxide, a nitride, or the like, the second conductive layer may be formed to include, e.g., a metal, a metal nitride, a metal silicide, or the like, and the third conductive layer may be formed to include a low resistance metal, e.g., copper, aluminum, tungsten, or the like.

In an implementation, the bit line 500 may have a barrier layer pattern (not illustrated) including, e.g., a metal nitride.

As described above, the phase change material layer may be formed by a CVD process or an ALD process in a recess having a high aspect ratio using the deposition source including the first tellurium precursor represented by Formula 1 and the second tellurium precursor represented by Formula 2. As a result, deterioration (due to decreasing gap-fill characteristic) of the phase change material layer may be prevented.

For example, the deposition source may include the second tellurium precursor in an amount of less than about 1 percent by weight, with respect to or based on the total weight of the deposition source, and may be provided at a temperature of less than about 120° C. As a result, the deposition rate may not be decreased, and particles may not be excessively generated during the formation of the phase change material layer. Thus, deterioration of the phase change material layer may be prevented.

By way of summation and review, a chalcogenide compound may be deposited in an inner wall of an opening having a high aspect ratio, due to a high integration degree of the phase change memory (PRAM) device. For example, the phase change material layer may be formed by a chemical vapor deposition (CVD) process or an atomic layer deposition (ALD) process, which may have good gap-fill characteristics or a high step coverage. When the phase change material layer is formed by a CVD process or an ALD process, a deposition rate of the phase change material layer may be decreased and/or particles may be generated in accordance with process conditions.

The embodiments may provide a method of forming a thin layer in which a deposition rate of the thin layer may be increased and fewer particles may be generated.

The embodiments may provide a method of manufacturing a phase change memory device in which a deposition rate of a layer may be increased and fewer particles may be generated.

According to an embodiment, the phase change material layer may be formed easily by a CVD process or an ALD process in which a deposition rate of the phase change material layer may be increased and fewer particles may be generated.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A method of forming a thin layer, the method comprising:
providing a first deposition source onto a substrate, the first deposition source not including tellurium; and
providing a second deposition source onto the substrate, the second deposition source including a first tellurium precursor represented by the following Formula 1 and a second tellurium precursor represented by the following Formula 2:

$$Te(CH(CH_3)_2)_2 \qquad \text{Formula 1}$$

$$Te_n(CH(CH_3)_2)_2 \qquad \text{Formula 2}$$

wherein, in Formula 2, n is an integer greater than or equal to 2.

2. The method as claimed in claim 1, wherein the second tellurium precursor is included in an amount of less than about 1 percent by weight, based on a total weight the second deposition source.

3. The method as claimed in claim 1, wherein the first deposition source includes at least one of boron (B), carbon (C), nitrogen (N), oxygen (O), aluminum (Al), silicon (Si), phosphorus (P), sulfur (S), zinc (Zn), gallium (Ga), germanium (Ge), arsenic (As), selenium (Se), zirconium (Zr), cadmium (Cd), indium (In), tin (Sn), antimony (Sb), lead (Pb), bismuth (Bi), or polonium (Po).

4. The method as claimed in claim 1, wherein the second deposition source is provided onto the substrate at a temperature of less than about 120° C.

5. The method as claimed in claim 1, wherein the second deposition source is provided onto the substrate by a liquid delivery system.

6. The method as claimed in claim 1, further comprising providing a reaction gas onto the substrate prior to providing the first deposition source onto the substrate, the reaction gas activating a reaction between the first deposition source and the second deposition source.

7. The method as claimed in claim 1, wherein the first deposition source is provided onto the substrate by a carrier gas.

8. A method of manufacturing a phase change memory device, the method comprising:
forming a lower electrode on a substrate;
forming a phase change material layer pattern on the lower electrode, wherein forming the phase change material layer pattern includes:
providing a first deposition source onto the lower electrode, the first deposition source not including tellurium; and
providing a second deposition source onto the lower electrode, the second deposition source including a first tellurium precursor represented by the following Formula 1 and a second tellurium precursor represented by the following Formula 2; and
forming an upper electrode on the phase change material layer pattern:

$$Te(CH(CH_3)_2)_2 \qquad \text{Formula 1}$$

$$Te_n(CH(CH_3)_2)_2 \qquad \text{Formula 2}$$

wherein, in Formula 2, n is an integer greater than or equal to 2.

9. The method as claimed in claim 8, wherein forming the lower electrode includes:
forming an insulating interlayer on the substrate such that the insulating interlayer has a lower electrode layer pattern; and
removing an upper portion of the lower electrode layer pattern to form a recess.

10. The method as claimed in claim 9, wherein forming the phase change material layer pattern includes:
forming the phase change material layer on the lower electrode and the insulating interlayer to fill the recess; and
planarizing an upper portion of the phase change material layer until a top surface of the insulating interlayer is exposed.

11. The method as claimed in claim 8, wherein the second tellurium precursor is included in an amount of less than about 1 percent by weight, based on a total weight the second deposition source.

12. The method as claimed in claim 8, wherein the first deposition source includes at least one of boron (B), carbon (C), nitrogen (N), oxygen (O), aluminum (Al), silicon (Si), phosphorus (P), sulfur (S), zinc (Zn), gallium (Ga), germanium (Ge), arsenic (As), selenium (Se), zirconium (Zr), cadmium (Cd), indium (In), tin (Sn), antimony (Sb), lead (Pb), bismuth (Bi), or polonium (Po).

13. The method as claimed in claim 8, wherein the second deposition source is provided onto the substrate at a temperature of less than about 120° C.

14. The method as claimed in claim 8, wherein forming the phase change material layer pattern on the lower electrode further includes providing a reaction gas onto the substrate, the reaction gas activating a reaction between the first deposition source and the second deposition source, prior to providing the first deposition source.

15. A method of forming a thin layer, the method comprising:
   providing a substrate;
   providing a first deposition source onto the substrate, the first deposition source being free of tellurium; and
   providing a second deposition source onto the substrate, the second deposition source including:
   a first tellurium precursor represented by the following Formula 1:

$$Te(CH(CH_3)_2)_2, \text{ and} \quad\quad\quad \text{Formula 1}$$

a second tellurium precursor represented by the following Formula 2:

$$Te_n(CH(CH_3)_2)_2, \quad\quad\quad \text{Formula 2}$$

wherein, in Formula 2, n is an integer greater than or equal to 2.

16. The method as claimed in claim 15, wherein the first deposition source is provided onto the substrate prior to providing the second deposition source onto the substrate.

17. The method as claimed in claim 15, wherein the first deposition source is provided simultaneously with the second deposition source onto the substrate.

18. The method as claimed in claim 15, wherein the second tellurium precursor is included in the second deposition source in an amount of less than about 1 percent by weight, based on a total weight the second deposition source.

19. The method as claimed in claim 15, wherein the second deposition source is provided onto the substrate at a temperature of less than about 120° C.

20. The method as claimed in claim 15, wherein providing the first deposition source and the second deposition source onto the substrate are a part of a chemical vapor deposition process or an atomic layer deposition process.

\* \* \* \* \*